United States Patent
Huseinovic et al.

(10) Patent No.: US 9,607,803 B2
(45) Date of Patent: Mar. 28, 2017

(54) HIGH THROUGHPUT COOLED ION IMPLANTATION SYSTEM AND METHOD

(71) Applicant: Axcelis Technologies, Inc., Beverly, MA (US)

(72) Inventors: Armin Huseinovic, Winchester, MA (US); Joseph Ferrara, Georgetown, MA (US); Brian Terry, Amesbury, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 0 days.

(21) Appl. No.: 14/817,893

(22) Filed: Aug. 4, 2015

(65) Prior Publication Data

US 2017/0040141 A1    Feb. 9, 2017

(51) Int. Cl.
   *H01J 37/00*     (2006.01)
   *H01J 37/20*     (2006.01)
   (Continued)

(52) U.S. Cl.
   CPC ............ *H01J 37/20* (2013.01); *H01J 37/185* (2013.01); *H01J 37/3171* (2013.01); *H01L 21/6831* (2013.01)

(58) Field of Classification Search
   CPC ...... H01J 37/20; H01J 37/3171; H01J 37/185; H01L 21/6831
   (Continued)

(56) References Cited

U.S. PATENT DOCUMENTS 4,733,091 A    3/1988   Robinson et al.
4,949,783 A    8/1990   Lakios et al.
(Continued)

FOREIGN PATENT DOCUMENTS

WO    94/11944 A1    5/1994

OTHER PUBLICATIONS

Notice of Allowance Dated Mar. 4, 2016 U.S. Appl. No. 14/317,778.
(Continued)

*Primary Examiner* — Michael Maskell
(74) *Attorney, Agent, or Firm* — Eschweiler & Associates, LLC

(57) ABSTRACT

An ion implantation system has a process chamber having a process environment, and an ion implantation apparatus configured to implant ions into a workpiece supported by a chuck within the process chamber. A load lock chamber isolates the process (vacuum) environment from an atmospheric environment, wherein a load lock workpiece support supports the workpiece therein. An isolation chamber is coupled to the process chamber with a pre-implant cooling environment defined therein. An isolation gate valve selectively isolates the pre-implant cooling environment from the process environment wherein the isolation chamber comprises a pre-implant cooling workpiece support for supporting and cooling the workpiece. The isolation gate valve is the only access path for the workpiece to enter and exit the isolation chamber. A pressurized gas selectively pressurizes the pre-implant cooling environment to a pre-implant cooling pressure that is greater than the process pressure for expeditious cooling of the workpiece. A workpiece transfer arm transfer the workpiece between the load lock chamber, isolation chamber, and chuck. A controller controls the workpiece transfer arm selectively cools the workpiece to a pre-implant cooling temperature in the isolation chamber at the pre-implant cooling pressure via a control of the isolation gate valve, pre-implant cooling workpiece support, and pressurized gas source.

28 Claims, 2 Drawing Sheets

(51) Int. Cl.
*H01J 37/317* (2006.01)
*H01J 37/18* (2006.01)
*H01L 21/683* (2006.01)

(58) Field of Classification Search
USPC .......................................... 250/492.1–492.3
See application file for complete search history.

(56) References Cited

U.S. PATENT DOCUMENTS

| | | | |
|---|---|---|---|
| 5,134,301 A | 7/1992 | Kamata et al. | |
| 5,314,541 A | 5/1994 | Saito et al. | |
| 5,357,115 A | 10/1994 | Asakawa et al. | |
| 5,484,011 A | 1/1996 | Tepman et al. | |
| 5,565,034 A | 10/1996 | Nanbu et al. | |
| 5,751,003 A | 5/1998 | Rose et al. | |
| 5,878,943 A | 3/1999 | Nishikawa et al. | |
| 5,980,195 A | 11/1999 | Miyashita | |
| 5,989,346 A | 11/1999 | Hiroki | |
| 6,158,951 A | 12/2000 | Carr et al. | |
| 6,719,517 B2 | 4/2004 | Beaulieu et al. | |
| 6,740,894 B1 | 5/2004 | Mitchell | |
| 6,855,916 B1 | 2/2005 | Matthews et al. | |
| 6,896,513 B2 | 5/2005 | Bachrach et al. | |
| 6,900,444 B2 | 5/2005 | Ferrara et al. | |
| 7,010,388 B2 | 3/2006 | Mitchell et al. | |
| 7,019,263 B2 | 3/2006 | Ishihara | |
| 7,960,297 B1 | 6/2011 | Rivkin et al. | |
| 8,089,055 B2 | 1/2012 | Brailove | |
| 8,193,513 B2 | 6/2012 | DiVergilio et al. | |
| 8,227,768 B2 | 7/2012 | Smick et al. | |
| 8,319,196 B2 * | 11/2012 | England | H01L 21/26593 118/723 CB |
| 8,450,193 B2 | 5/2013 | England et al. | |
| 8,616,820 B2 | 12/2013 | Kurita et al. | |
| 8,668,816 B2 | 3/2014 | Ding et al. | |
| 9,117,628 B2 | 8/2015 | Kirkpatrick et al. | |
| 2002/0005168 A1 | 1/2002 | Kraus et al. | |
| 2002/0014407 A1 | 2/2002 | Allen et al. | |
| 2003/0057130 A1 | 3/2003 | Fix et al. | |
| 2003/0091410 A1 | 5/2003 | Larson et al. | |
| 2003/0113187 A1 | 6/2003 | Lei et al. | |
| 2003/0123958 A1 | 7/2003 | Sieradzki et al. | |
| 2004/0191028 A1 | 9/2004 | Tamai | |
| 2004/0234359 A1 | 11/2004 | Mitchell et al. | |
| 2005/0063799 A1 | 3/2005 | Larson et al. | |
| 2005/0232727 A1 | 10/2005 | Ferrara | |
| 2005/0274459 A1 | 12/2005 | Tanase et al. | |
| 2006/0021702 A1 | 2/2006 | Kumar et al. | |
| 2006/0219952 A1 | 10/2006 | Mehta et al. | |
| 2007/0189880 A1 | 8/2007 | Bufano et al. | |
| 2007/0264106 A1 | 11/2007 | Van Der Meulen | |
| 2008/0138175 A1 | 6/2008 | Mitchell et al. | |
| 2008/0138178 A1 | 6/2008 | Ferrara et al. | |
| 2008/0199612 A1 | 8/2008 | Keevers et al. | |
| 2008/0217812 A1 | 9/2008 | Perrone | |
| 2008/0225261 A1 | 9/2008 | Hirayanagi | |
| 2009/0200494 A1 | 8/2009 | Hatem et al. | |
| 2011/0143461 A1 | 6/2011 | Fish et al. | |
| 2011/0291030 A1 | 12/2011 | Lee | |
| 2013/0112334 A1 | 5/2013 | Tsuno et al. | |
| 2013/0320208 A1 * | 12/2013 | Lee | H01J 37/185 250/289 |
| 2014/0034846 A1 * | 2/2014 | Lee | H01J 37/18 250/453.11 |
| 2014/0065730 A1 | 3/2014 | Reece et al. | |
| 2014/0361197 A1 | 12/2014 | Lee et al. | |
| 2015/0228515 A1 | 8/2015 | Lee | |

OTHER PUBLICATIONS

Office Action Dated Jun. 18, 2010 U.S. Appl. No. 11/634,644.
Final Office Action Dated Nov. 16, 2010 U.S. Appl. No. 11/634,644.
Office Action Dated May 9, 2013 U.S. Appl. No. 11/634,644.
Final Office Action Dated Nov. 1, 2013 U.S. Appl. No. 11/634,644.
Office Action Dated Jun. 15, 2010 U.S. Appl. No. 11/634,697.
Final Office Action Dated Nov. 16, 2010 U.S. Appl. No. 11/634,697.
Notice of Allowance Dated Feb. 17, 2011 U.S. Appl. No. 11/634,697.
U.S. Appl. No. 11/634,697, filed Dec. 6, 2006.
U.S. Appl. No. 11/634,644, filed Dec. 6, 2006.
U.S. Appl. No. 14/317,778, filed Jun. 27, 2014.

* cited by examiner

US 9,607,803 B2

HIGH THROUGHPUT COOLED ION IMPLANTATION SYSTEM AND METHOD

TECHNICAL FIELD

The present invention relates generally to ion implantation systems, and more specifically to a system and method for implanting a workpiece at sub-ambient temperatures in a high throughput ion implantation system.

BACKGROUND

For certain ion implantation processes used in mass production of semiconductor manufacturing, such as cold, low-temperature, or sub-ambient temperature ion implantation processes, there is an increasing need to achieve high workpiece throughput that approaches the throughput typically associated with room-temperature ion implantation processing. Cold ion implantation processes typically cool workpieces to temperatures in the range of −70° C. to −100° C., wherein cooling of the workpiece may be achieved via cooling of the electrostatic clamp or chuck (ESC) on which the workpiece resides during ion implantation processing.

A fundamental problem with conventional technology is that in order to perform the cold ion implantation process, the workpiece is typically cooled for an initial period prior to the commencement of the ion implantation process. This cooling period, often referred to as a "dwell time", is the period in which the workpiece is being allowed to reach a desired steady state temperature prior to starting the implantation process. The dwell time associated with pre-implant cooling is performed in series with other workpiece processing steps, and as such, increases the overall per-workpiece processing time.

There are two fundamentally different approaches in cooling the workpiece, which are mainly defined by the workpiece environment during the thermal transient associated with the pre-implant cooling. In a first approach, the workpiece can be placed at a so-called pre-implant chill station that is enclosed within a vacuum space associated with the ion implant process environment. At the pre-chill station, the workpiece is placed on a cooled wafer holder, whereby the workpiece is cooled to the desired process temperature. The workpiece is thereafter transferred to an electrostatic chuck (ESC) in the ion implant process environment to be scanned in front of an ion beam to undergo the ion implantation process.

In a second approach, the workpiece can be pre-cooled in the high-vacuum ion implant process environment, using the ESC or a chuck similar to the ESC used for the ion implantation process. Using this approach, the ESC can be configured to cool the workpiece prior to ion implantation (e.g., pre-implant cooling) and can also be configured to provide active in-situ cooling of the workpiece during the ion implantation process.

Conventionally, pre-implant cooling utilizing the ESC would employ a back side gas as a thermal media for cooling of the workpiece. In accordance with this in-situ cooling approach, the dwell time can typically be reduced as the workpiece can be brought to process temperature while in position for ion implantation, and possibly even during the commencement of the implantation process. However, the use of an in-vacuum ESC for parallel workpiece pre-implant cooling, in-situ cooling, and ion implantation can be very costly due to the cost associated with the technical modifications to the electrostatic chucking apparatus that are typically necessary to provide sufficient workpiece cooling while maintaining electrostatic forces sufficient to hold the workpiece in a fixed position while being scanned during the ion implant process.

Both of these conventional approaches suffer from the fact that when the workpiece is placed in a pre-implant vacuum environment for cooling, or is placed in the process environment, which is also a vacuum environment, heat transfer between the workpiece and ESC is limited by the thermal conductivity of the workpiece-to-cooling platen or chuck interface, which is determined by the back-side gap size, quality of contact between the workpiece and the chuck, and back side gas pressure.

SUMMARY

The present disclosure appreciates that it would be advantageous to provide workpiece cooling in an environment at an elevated pressure above a vacuum pressure associated with an ion implantation environment, whereby the time necessary for bringing the workpiece to a desired cooled process temperature is decreased. An atmospheric pressure interface layer, for example, can be maintained behind the workpiece so that the heat transfer rate can be increased.

The present disclosure further appreciates that cooling the workpiece in an ambient atmospheric environment to a predetermined temperature range suitable for low temperature or cold ion implantation processes can induce undesirable and unacceptable condensation on the surface of the workpiece. Accordingly, the present disclosure provides a solution for low-temperature ion implantation that can overcome the above-mentioned shortcomings. In particular, the present invention provides an isolation chamber that is entirely isolated from the atmospheric environment, yet can be configured for pre-implant cooling in a non-vacuum environment at pressures greater than those in the ion implantation environment or other vacuum environment(s) associated therewith.

Therefore, the present disclosure overcomes the limitations of the prior art by providing a system, apparatus, and method for low temperature or "cold" ion implantation and for maintaining reasonable process throughput in a sub-atmospheric temperature ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present disclosure provides a separate and isolated environment for workpiece cooling in the form of an independently-controlled isolation chamber having a cooling system or cooling element incorporated within, wherein the isolation chamber is configured to provide workpiece cooling in a relatively high-pressure or controlled-pressure environment. The isolation chamber, for example, is remote and isolated from the ambient atmospheric environment and humidity conditions thereof. Thus, the isolation chamber substantially improves thermal communication between the workpiece and the thermal element utilized for cooling the workpiece due to the relative high-pressure environment thereof, while eliminating or mitigating the effects of cold humid air and relative humidity in the ambient environment, which could otherwise result in condensation and the formation of ice on the surface of the workpiece. Such a high-pressure thermal interface significantly increases a heat transfer rate and therefore substantially improves upon the time to reach thermal equilibrium at a desired workpiece processing temperature. In addition, the costs associated with the isolated high-pressure environment pre-chilling system, for example, can be substantially better than the conventional ESC pre-implant cooling and/or in-situ ESC cooling systems and other conventionally used approaches.

In addition, in order to improve workpiece throughput, workpiece cooling in the low-temperature ion implantation process can be segmented and configured such that some temperature decreases can be provided on a parallel path along with other segments of workpiece movement throughout the ion implantation process. Consequently, a pre-implant cooled workpiece can be readied for low temperature ion implantation processing, while another workpiece is being implanted with ions. Accordingly, workpiece dwell time, the amount of time taken to bring the workpiece to processing temperature, also called "time-to-temperature", can be partially, or entirely taken out of the ion implantation process critical path, thereby improving workpiece throughput.

Thus, in accordance with the present disclosure, an ion implantation system for implanting ions into a cold or sub-ambient temperature workpiece is provided. The ion implantation system, for example, comprises a process chamber having a process environment associated therewith. An ion implantation apparatus is further configured to provide a plurality of ions to a workpiece positioned in the process chamber. A chuck, such as an electrostatic chuck (ESC), is configured to support the workpiece within the process chamber during an exposure of the workpiece to the plurality of ions. The chuck, in one example, is further configured to cool the workpiece to a sub-ambient process temperature.

A load lock chamber is further operably coupled to the process chamber, wherein the load lock chamber is configured to selectively separate the process environment from an atmospheric environment. The atmospheric environment, for example, is at an atmospheric pressure, temperature, and relative humidity level, and the process environment is at a process pressure and relative humidity level that is substantially lower (e.g., a vacuum) than the pressure and relative humidity of the atmospheric environment. The load lock chamber, for example, comprises a pair of selectively operable load lock gate valves and a load lock workpiece support configured to support the workpiece during an exchange and transfer of the workpiece form the ambient atmospheric environment to the process environment, and subsequently, from the process environment back to the ambient atmospheric environment.

According to one exemplary aspect, an isolation chamber is operably coupled to the process chamber, wherein the isolation chamber has a pre-implant cooling system and/or selectively controllable pressure environment associated therewith. The isolation chamber, for example, comprises an isolation gate valve configured to selectively isolate the pre-implant cooling environment of the isolation chamber from the process environment and to selectively permit access of the workpiece to the pre-implant cooling environment. The isolation gate valve defines the only access path for allowing the workpiece to enter and exit the isolation chamber. The isolation chamber, for example, further comprises a pre-implant cooling workpiece support configured to support and cool the workpiece within the isolation environment. More specifically, the isolation chamber and isolation gate valve are configured to operate so that the pre-implant cooling can be carried out at an independently-controlled selected pressure while being remote and continuously and constantly isolated from ambient atmospheric conditions.

The pre-implant cooling workpiece support, for example, comprises a chilled platen configured to contact a bottom surface of the workpiece, thereby supporting and cooling the workpiece within the pre-implant cooling environment. The pre-implant cooling workpiece support, for example, may comprise one or more of a Peltier cooler, an expansion chamber, a cryogenic head, and a circulatory refrigeration loop. For example, the chilled platen can comprise one or more coolant passages defined therein, wherein the chilled platen is configured to cool the workpiece via a circulation of a coolant fluid through the coolant passages. In another example, the chuck further comprises chuck coolant passages defined therein, wherein the coolant fluid further circulates through the chuck coolant passages for providing additional workpiece cooling during the ion implantation process, either to further decrease the temperature of the workpiece delivered thereto, or to maintain the decreased temperature of the workpiece delivered thereto. The isolation chamber, for example, can further comprise a pin lifter mechanism configured to selectively raise and lower the workpiece with respect to the pre-implant cooling workpiece support, or the workpiece can remain stationary on independent supports while the chilled platen is raised for cooling the workpiece.

A pressurized gas source, for example, is operably coupled to the isolation chamber, wherein the pressurized gas source is configured to selectively pressurize the pre-implant cooling environment with a substantially dry gas to a pre-implant cooling pressure when the isolation gate valve of the isolation chamber is closed. The pre-implant cooling pressure, in one example, is greater than the process pressure (e.g., vacuum pressure), and is selected from a range of pressures extending from the process pressure to the atmospheric pressure. In another example, the pre-implant cooling pressure is greater than the atmospheric pressure. The dry gas, for example, comprises one or more of desiccated air, dry nitrogen, dry helium, or other suitable dry gas.

According to another exemplary aspect, a workpiece transfer arm is configured to selectively transfer the workpiece between two or more of the load lock chamber, the isolation chamber, and the process chamber. A controller is further provided and configured to selectively transfer the workpiece between the load lock workpiece support, the pre-implant cooling workpiece support, and the chuck via a control of the workpiece transfer arm. The controller, for example, is further configured to selectively cool the workpiece to a pre-implant cooling temperature within the isolation chamber at the pre-implant cooling pressure via a control of the isolation gate valve, the pre-implant cooling workpiece support, and the pressurized gas source. The controller may be further configured to determine the pre-implant cooling temperature and pressure based, at least in part, on a desired process throughput. Further, a temperature monitoring system may be provided and configured to measure a temperature of the workpiece at or in the isolation chamber, wherein the controller is further configured to control the selective cooling of the workpiece to the pre-implant cooling temperature based, at least in part, on the measured temperature of the workpiece.

A vacuum source, for example, can be further operably coupled to the isolation chamber, wherein the controller is further configured to selectively evacuate the isolation chamber to approximately the process pressure via a control of the vacuum source and the isolation gate valve. For example, the controller is configured to selectively evacuate the isolation chamber after the workpiece is cooled to the pre-implant cooling temperature at the pre-implant cooling pressure in order to allow the cooled workpiece to be delivered to the process chamber and chuck therein for ion implantation.

According to yet another example, a post-implant heat station may be provided, which is operably coupled to the process chamber, wherein the post-implant heat station comprises a heated workpiece support configured to heat the workpiece to a post-implant temperature that is greater than a dew point temperature of the atmospheric environment to eliminate or mitigate the possibility of condensation forming on the cooled workpiece. The post-implant heat station, for example, may be defined within the load lock chamber, or may be alternatively appended to the process chamber or may even reside within the process chamber.

In accordance with another exemplary aspect, a method for implanting ions into a workpiece at sub-ambient temperatures is provided. According to one example, the method comprises an initial step of providing a workpiece in an atmospheric environment at an atmospheric temperature and atmospheric pressure. The workpiece is transferred from the atmospheric environment to a load lock chamber of an ion implantation system, and the pressure within the load lock chamber is lowered to a process pressure associated with a process environment of a process chamber.

The workpiece is then transferred at the process pressure from the load lock chamber, through the process chamber, and onto a pre-implant cooling workpiece support in an isolation chamber. The workpiece is further subsequently isolated from the process pressure of the process chamber within the isolation chamber, such as through the isolation gate valve described above. Dry gas (e.g., one or more of desiccated air, nitrogen, and helium) is then dispensed or leaked into the isolation chamber, thus raising the pressure in the isolation chamber to a pre-implant cooling pressure that is higher than the process pressure in order to improve thermal communication between the pre-implant cooling station and the workpiece via the thermal conductivity of the introduced gas. The workpiece is cooled to a pre-implant cooling temperature in the isolation chamber at the pre-implant cooling pressure via the pre-implant cooling workpiece support. Thereafter, the isolation chamber is pumped so that the pressure within the isolation chamber is again lowered to the process pressure. It is noted that the pre-implant cooling workpiece support, for example, can chill the workpiece at other pressures than the pre-implant cooling pressure, such as concurrent with the raising and/or lowering of the pressure within the isolation chamber.

In accordance with one example, after the pressure is lowered to within a predetermined range of the process pressure, the workpiece is transferred from the isolation chamber to a chuck residing in the process environment of the process chamber, and ions are implanted into the workpiece. For example, the chuck (e.g., an electrostatic chuck) can be further cooled to a predetermined process temperature utilizing back side gas as a thermal medium to further decrease or maintain the workpiece at a process temperature during ion implantation. Alternatively, the pre-implant cooling temperature is selected such that any heating of the workpiece during implantation is maintained within an acceptable range, wherein no additional cooling by the chuck is provided.

Once ion implantation is complete, the workpiece is transferred from the chuck to the load lock chamber, and the load lock chamber pressure is increased to the atmospheric pressure for allowing transfer of the workpiece back to the ambient environment. The load lock may incorporate a heating support structure for heating the workpiece to a temperature above the dew point temperature so that it can be further transferred from the load lock chamber to the atmospheric environment without concern for condensation thereon. The load lock chamber, while described as a single load lock chamber, can alternatively comprise a plurality of load lock chambers, wherein the workpiece is configured to be transferred to any of the plurality of load lock chambers.

In accordance with another example, transferring the workpiece from the chuck to the load lock chamber can further comprise transferring the workpiece from the chuck to a post-implant heat station. The workpiece, for example, is heated in the post-implant heat station to a post-implant heat temperature that is greater than a dew point temperature of the atmospheric environment, wherein the workpiece is subsequently transferred from the post-heat station to the load lock chamber and then to the atmospheric environment. Thus, condensation concerns associated with the cold implant are abated.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
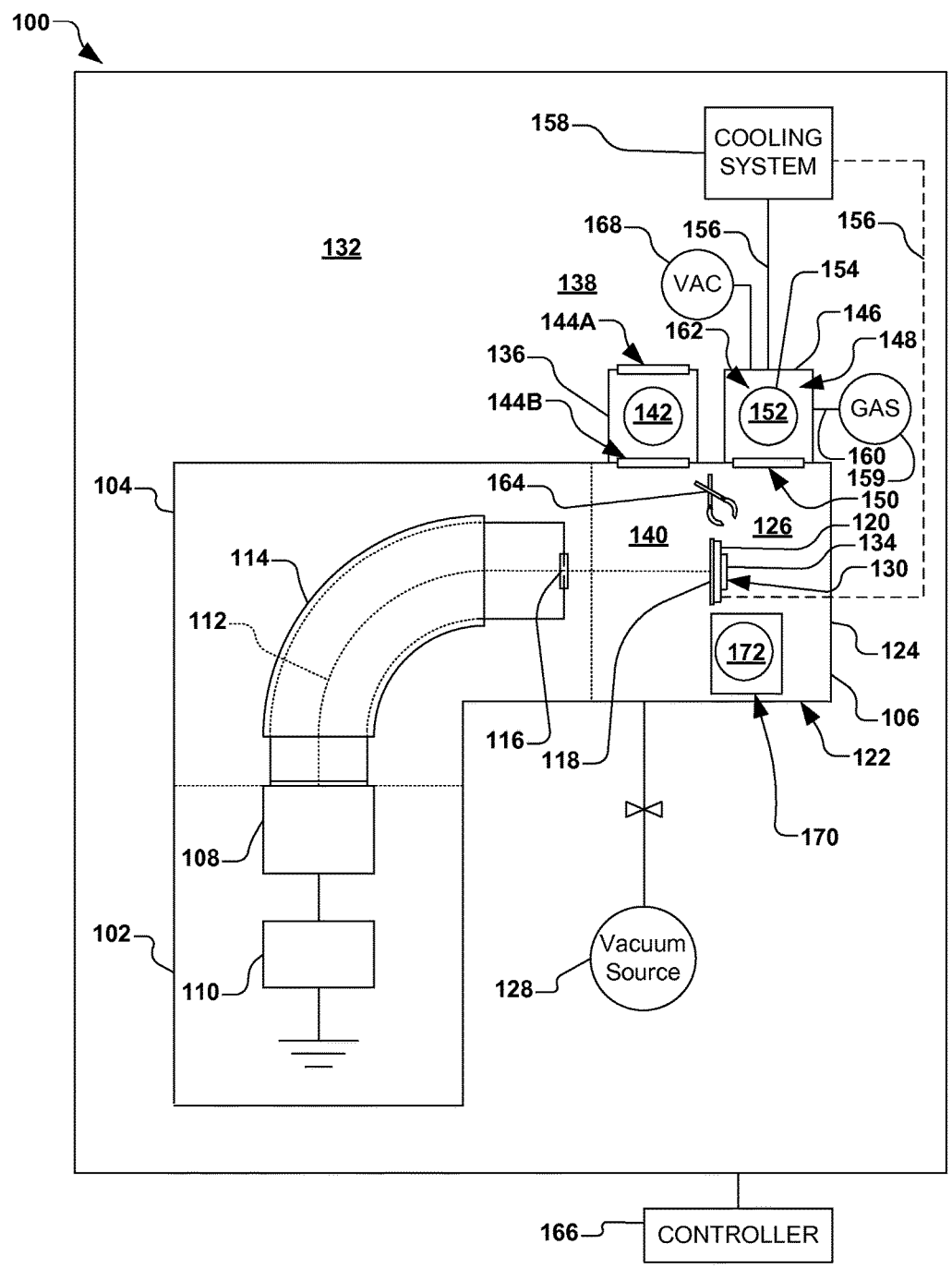
FIG. 1 is a block diagram of an exemplary ion implantation system comprising an isolated low temperature chamber in accordance with several aspects of the present disclosure.

The present disclosure is directed generally toward a system, apparatus, and method for cooling a workpiece and providing increased process throughput in a chilled or sub-ambient temperature ion implantation system. Accordingly, the present invention will now be described with reference to the drawings, wherein like reference numerals may be used to refer to like elements throughout. It will be understood that the description provided herein is merely illustrative and that this detailed description should not be interpreted in a limiting sense. In the following description, for purposes of explanation, numerous specific details are set forth in order to provide a thorough understanding of the present invention. It will be evident to one skilled in the art, however, that the present invention may be practiced without certain of these specific details. Further, the scope of the invention is not intended to be limited by the embodiments or examples described hereinafter with reference to the accompanying drawings, but is intended to be only limited by the appended claims and substantial equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented via wireless communication, unless noted to the contrary.

In accordance with one aspect of the present disclosure, FIG. 1 illustrates an exemplary ion implantation system 100. The ion implantation system 100, for example, comprises a terminal 102, a beamline assembly 104, and an end station 106. It will be understood that various other types of vacuum-based semiconductor processing and manufacturing systems are also contemplated to be within the scope of the present invention, such as, in particular, plasma processing systems. In addition, while a single-wafer processing system is illustrated and described, the present invention could apply equally to a batch or multi-wafer processing system.

Generally, an ion source 108 in the terminal 102 is coupled to a power supply 110 for ionizing a dopant gas into a plurality of ions to form an ion beam 112. The ion beam 112 in the present example is directed through a mass analyzing apparatus 114, which filters out appropriate ion species to pass through an aperture 116 towards the end station 106. In the end station 106, the ion beam 112 bombards a workpiece 118 (e.g., a semiconductor substrate such as a silicon wafer, a display panel, etc.), which is selectively clamped or mounted to a chuck 120 (e.g., an electrostatic chuck or ESC). Once embedded into the lattice of the workpiece 118, the implanted ions change the physical, electrical and/or chemical properties of the workpiece. Ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure. In addition, as previously noted, it will be understood that the present invention can be incorporated into a plasma processing system such that the term "ion implantation" should be understood to include plasma processing systems and plasma ion implant immersion (PIII) systems.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

During ion implantation utilizing the ion implantation system 100, energy can build up on the workpiece 118 in the form of heat, as the charged ions collide with the workpiece. Absent countermeasures, such heat can potentially warp or crack the workpiece 118, which may render the workpiece worthless (or significantly less valuable) in some implementations. The heat can further cause the dose of ions delivered to the workpiece 118 to differ from the dosage desired, which can alter functionality from what is desired. Furthermore, in some circumstances, it is desirable to not only cool the workpiece 118 during implantation to prevent heat build-up, but it may be further desirable to implant ions at a temperature below or above an ambient temperature. In the case of sub-ambient or low temperature ion implantation, it is known that low workpiece temperature during implantation is desirable for enabling amorphization of the surface of the workpiece 118, thereby enabling, among other things, ultra-shallow junction formation in advanced CMOS integrated circuit device manufacturing.

Thus, in accordance with another example, the chuck 120 may comprise a sub-ambient temperature chuck 130, wherein the sub-ambient temperature chuck is configured to both support and cool or otherwise maintain a predetermined temperature on the workpiece 118 within the process chamber 122 during the exposure of the workpiece to the ion beam 112. It should be noted that while the chuck 120 is referred to in the present example as being the sub-ambient temperature chuck 130, the chuck 120 can likewise comprise a super-ambient temperature chuck (not shown), wherein the super-ambient temperature chuck is also configured to support and heat the workpiece 118 within the process chamber 122. In yet another alternative, the chuck 120 can provide no thermal heating or cooling; rather, the chuck may be thermally insulated from the workpiece 118 to reduce or dampen temperature increase of the workpiece.

In one example, the sub-ambient temperature chuck 130 comprises an electrostatic chuck (ESC) configured to cool or chill the workpiece 118 to a sub-ambient processing temperature that is considerably lower than the ambient or atmospheric temperature of the surroundings or the external or atmospheric environment 132, or the temperature of the process environment 126 within the end station 106. A cooling system 134 may be further provided, wherein, in another example, the cooling system is configured to cool or chill the sub-ambient temperature chuck 130, and thus, the workpiece 118 residing thereon, to the desired sub-ambient processing temperature. In another example, and in a similar manner, a heating system (not shown) may be further provided in the case of a super-ambient temperature chuck, wherein the heating system is configured to heat the super-ambient temperature chuck and workpiece 118 residing thereon to the desired processing temperature.

In accordance with another aspect, a load lock chamber 136 is further operably coupled to the process chamber 122 of the end station 106, wherein the load lock chamber is configured to isolate the process environment 126, typically close to vacuum pressure, from the atmospheric environment 132, typically at atmospheric pressure 138 (e.g., approx. 760 torr) while allowing transfer of workpieces 118 to and from the atmospheric environment and the process chamber. The process environment 126, for example, is generally maintained at a process pressure 140 that is substantially lower than the atmospheric pressure 138, such as a process pressure of approximately 5-7 torr. The load lock chamber 136, for example, further comprises a load lock workpiece support 142 configured to support the workpiece 118 during a transfer of the workpiece from the atmospheric pressure 138 of the atmospheric environment 132 to the process pressure of the process environment 126 in the process chamber 122, and/or from the process environment 126 of the process chamber 122 to the atmospheric pressure 138 of the atmospheric environment 132. For example, a plurality of load lock doors or so-called gate valves 144A, 144B operably couple the load lock chamber 136 to the respective process chamber 122 and the atmospheric environment 132. A pump and purge valve system (not shown) is also provided to enable the pressure changes necessary within the load lock chamber 136 for enabling transfer of the workpiece 118 between the respective atmospheric environment 132 and process environment 126.

In some exemplary operations of the ion implantation system 100, the processing temperature is below the ambient dew point (also called dew point temperature) of the atmospheric environment 132, such as a processing temperature of approximately −40° C. to −100° C. In such an operation, since the processing temperature is significantly lower than the dew point temperature of the atmospheric environment 132, warming of the workpiece 118 prior to return exposure to the atmospheric environment can also be provided in order to prevent formation of condensation on the workpiece, as will be discussed in greater detail hereafter.

The inventors appreciate that conventional cooling of the workpieces can deleteriously affect cycle time through a conventional ion implantation system, wherein this cycle time translates to workpiece throughput, a significant product specification in the world of semiconductor equipment manufacturing and semiconductor manufacturing processes. Conventionally, in a system that relies on workpiece cooling via a cooled chuck, the workpiece is allowed to rest or "soak" on the cooled chuck for a period of time (e.g., a "dwell time") until the workpiece reaches the desired temperature. Such conventional cooling increases cycle time, thus decreasing throughput of the ion implantation process.

In order to increase process throughput, the present disclosure advantageously provides an isolation chamber 146 operably coupled to the process chamber 122. For example, the isolation chamber 146 may be adjacent to, or operably coupled to, the load lock chamber 136. The isolation chamber 146, for example, has a pre-implant cooling environment 148 defined therein, wherein the isolation chamber comprises an isolation gate valve 150 configured to selectively isolate the pre-implant cooling environment from the process environment 126 and to selectively permit access of the workpiece 118 to the pre-implant cooling environment, while further isolating the pre-implant cooling environment from the atmospheric environment 132 and defining the only access path for the workpiece to enter and exit the isolation chamber and/or the process chamber 122. In other words, the only access path for the workpiece 118 to be transferred into or out of the isolation chamber 146 to or from the process chamber 122 is through the isolation gate valve 150. The isolation chamber 146, for example, further comprises a pre-implant cooling workpiece support 152 configured to support and cool the workpiece 118 within the pre-implant cooling environment 148.

The pre-implant cooling workpiece support 152, for example, may comprise a chilled platen 154 configured to contact a bottom surface of the workpiece 118, thereby supporting and cooling the workpiece within the pre-implant cooling environment 148. The chilled platen 154, for example, may comprise one or more coolant passages defined therein, wherein the chilled platen is configured to cool the workpiece via a circulation of a coolant fluid 156 through the coolant passages via a cooling system 158. In one example, the chuck 120 further comprises chuck coolant passages (not shown) defined therein, wherein the coolant fluid 156 further circulates through the chuck coolant passages via the cooling system 158. Alternatively, separate cooling systems and coolant fluids (not shown) may be implemented separately for the chuck 120 and the pre-implant cooling platen 154. The pre-implant cooling workpiece support 152 (and/or the sub-ambient temperature chuck 130) may alternatively comprise one or more of a Peltier cooler, an expansion chamber, a cryogenic head, and a circulatory refrigeration loop.

In accordance with another exemplary aspect of the present disclosure, a pressurized gas source 159 is operably coupled to the isolation chamber 146. The pressurized gas source 159, for example, is configured to selectively pressurize the pre-implant cooling environment 148 with a pre-implant cooling gas 160 to a pre-implant cooling pressure 162 when the isolation gate valve 150 is closed, wherein the pre-implant cooling pressure is greater than the process pressure 140. The pre-implant cooling pressure 162, for example, is selected from a range of pressures extending from the process pressure 140 to the atmospheric pressure 138. Alternatively, the pre-implant cooling pressure 162 is greater than the atmospheric pressure 138. For example, the pre-implant cooling gas 160 may comprise a dry gas (e.g., desiccated air, nitrogen, helium, or mixture thereof) that is then input or fed into the isolation chamber 146, to thereby increase the pressure to a desired pre-implant cooling pressure 162 that is higher than the process pressure 140, whereby improved thermal communication between the isolation chamber and the workpiece 118 is attained via the thermal conductivity of the introduced pre-implant cooling gas at elevated pressure relative to the vacuum pressure of the process chamber 122.

According to another example, a workpiece transfer arm 164 is provided and configured to selectively transfer the workpiece 118 between two or more of the load lock chamber 136, the isolation chamber 146, and the process chamber 122. A controller 166 is further provided and configured to selectively transfer the workpiece 118 between the load lock workpiece support 142, the pre-implant cooling workpiece support 152, and the chuck 120 via a control of the workpiece transfer arm 164. The controller 166 is further configured to selectively cool the workpiece 118 to a pre-implant cooling temperature within the isolation chamber 146 at the pre-implant cooling pressure 162 via a control of the isolation gate valve 150, the pre-implant cooling workpiece support 152, and the pressurized gas source 159. For example, the controller 166 is further configured to selectively evacuate the isolation chamber 146 after the workpiece 118 is cooled to the pre-implant cooling temperature at the pre-implant cooling pressure 162. For example, a pre-implant cooling vacuum source 168 is operably coupled to the isolation chamber 146, wherein the controller 166 is further configured to selectively evacuate the isolation chamber 146 to a pressure approximately equal to the process pressure 140 via a control of the vacuum source and the isolation gate valve 150. It should be noted that the pre-implant cooling vacuum source 168 may be the same, integrated with, or separate from, the vacuum source 128. Further, the isolation chamber 146 may also comprise a pin lifter mechanism (not shown) configured to selectively raise and lower the workpiece 118 with respect to the pre-implant cooling workpiece support 152, thereby facilitating access to the workpiece by transfer arm 164, wherein the controller 166 is further operable to control the pin lifter mechanism as well as coordinate movement of the transfer arm 164.

In accordance with another example, a temperature monitoring system (not shown) is further provided, and configured to measure a temperature of the workpiece 118 at the isolation chamber 146. The controller 166, for example, is further configured to control cooling of the workpiece 118 to the pre-implant cooling temperature based, at least in part, on the measured temperature of the workpiece. The controller 166 may be further configured to determine the pre-implant cooling temperature as well as pressure, based, at least in part, on a desired process throughput. In yet another example, the process temperature may be lower or higher than the pre-implant cooling temperature, to allow for temperature increase during transfer from the isolation chamber 146 to the chuck 120, or to allow for further temperature decrease in the workpiece 118 upon delivery thereof to the chuck, whereby the chuck is further configured to chill the workpiece, as described above.

In another example, a post-implant heat station 170 may be operably coupled to the process chamber 122, wherein the post-implant heat station comprises a heated workpiece support 172 configured to heat the workpiece 118 to a post-implant temperature that is greater than a dew point temperature associated with the atmospheric environment 132. The post-implant heat station 170, for example, may be appended to the process chamber 122, positioned within the process chamber, or may be defined within the load lock chamber 136.

Figure 2:
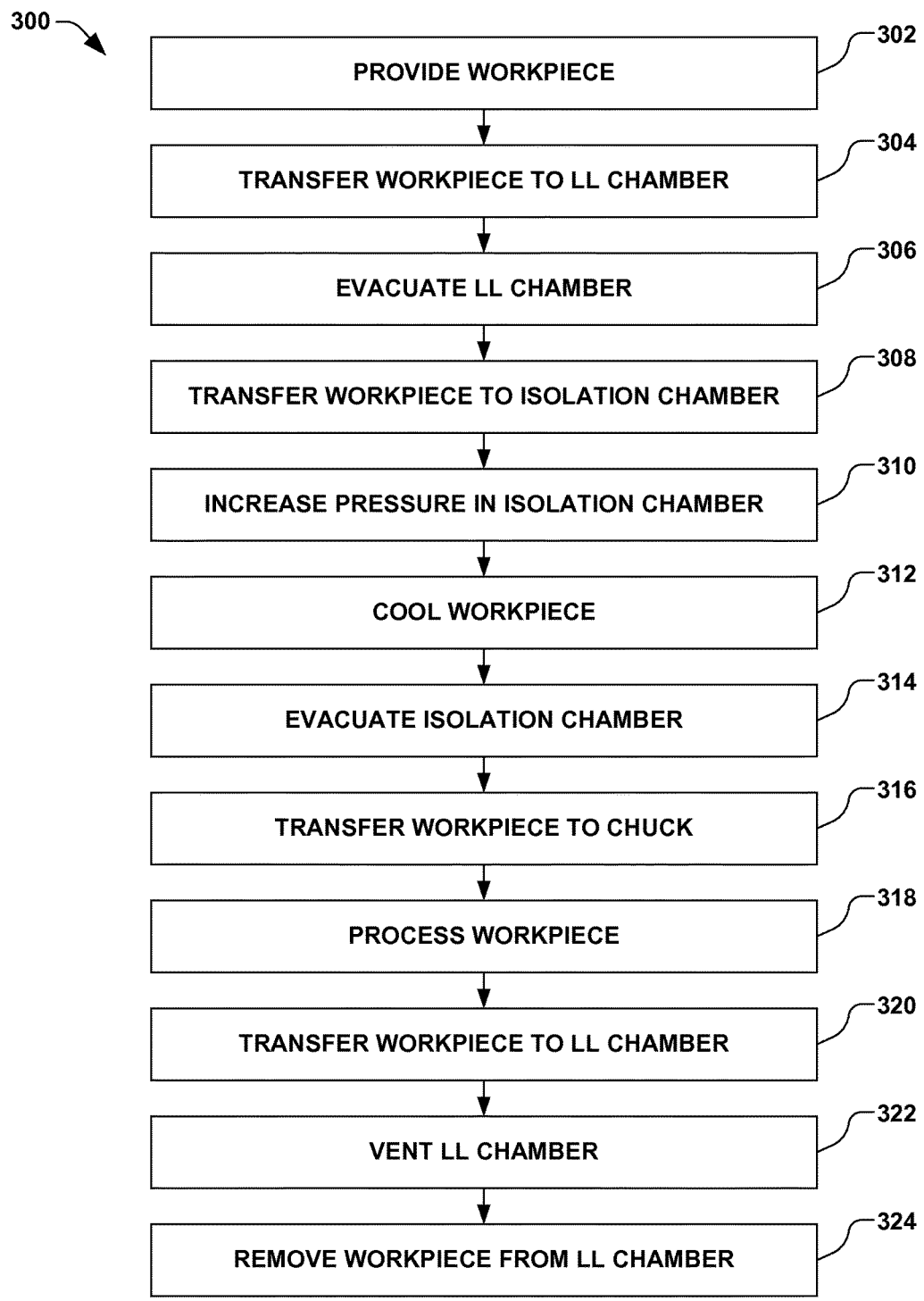
FIG. 2 illustrates a methodology for implanting ions into a workpiece at sub-ambient temperatures, in accordance with aspects of the present disclosure.

In accordance with another exemplary aspect of the invention, FIG. 2 illustrates an exemplary method 300 is provided for processing a workpiece at sub-ambient temperatures. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 300 of FIG. 2 begins at act 302, wherein a workpiece, in an atmospheric environment, at an atmospheric temperature and atmospheric pressure, is provided or delivered to the ion implantation system. In act 304, the first workpiece is transferred from the atmospheric environment to a load lock chamber, and in act 306, the load lock chamber is substantially evacuated to bring the pressure within the load lock chamber to a process pressure (e.g., the substantial vacuum pressure of the process chamber or end station). Once the pressure of the load lock chamber and the process chamber are substantially equivalent, the workpiece is then transferred (at the process pressure) from the load lock chamber and onto a pre-implant cooling workpiece support in an isolation chamber in act 308. In act 310, the workpiece in the isolation chamber is isolated from the process pressure of the process chamber within the isolation chamber by the closing of an isolation gate valve, and the pressure within the isolation chamber is raised to a pre-implant cooling pressure that is greater than the process pressure.

In act 312, the workpiece is cooled to a pre-implant cooling temperature in the isolation chamber at the pre-implant cooling pressure via the pre-implant cooling workpiece support, as described with respect to the description of FIG. 1 hereinabove. In one example, the pre-implant cooling pressure comprises a range of pressures extending from the process pressure to the atmospheric pressure. In another example, the pre-implant cooling pressure comprises a range of pressures extending from the process pressure to an elevated pressure that is greater than the atmospheric pressure. It will be appreciated that such increased pressure enhances thermal conduction between the pre-implant cooling workpiece support and the workpiece to enable faster chilling of the workpiece relative to chilling in a vacuum environment. In one exemplary embodiment, chilling the workpiece in the isolation chamber can be further enhanced by delivering dry, high pressure gas in the isolation chamber, for example, to fine tune soak times in order to optimize workpiece throughput. Further, the humidity level of the dry gas, for example, can be controlled to minimize condensation.

In act 314, once the desired pre-implant cooling temperature is achieved, the pressure within the isolation chamber is lowered back to the process pressure. It should be noted that the desired pre-implant cooling temperature may be the process temperature at which ion implantation will be performed, or may be at a temperature above the process temperature, wherein the workpiece will be further cooled to a lower temperature on the chuck in the process environment. It should also be noted that the cooling of act 312 may be performed concurrently with either or both of acts 310 and 314, whereby cooling of the workpiece can be initiated immediately upon delivery of the workpiece into the isolation chamber and/or once the workpiece is placed on the pre-implant cooling workpiece support. For example, the workpiece may be cooled during the pressure transitions, with or without the isolation chamber being at the pre-implant cooling pressure.

Moving to act 316, the isolation gate valve is opened and the workpiece is transferred from the isolation chamber to a chuck residing in the process environment of the process chamber. Once the workpiece is positioned firmly on the chuck, ions are implanted into the workpiece in act 318. Act 318, in one example, may further comprise cooling the chuck to a process temperature in order to maintain the temperature of the workpiece during ion implantation. In another example, the chuck may be cooled so that the workpiece positioned thereon can be further cooled to a temperature lower than the temperature of the workpiece delivered thereto.

Once ion implantation is complete, the workpiece is transferred from the chuck to the load lock chamber in act 320. In one example, the load lock chamber may comprise a heated platen or other heat source to serve as the heat station as described hereinabove, whereby the workpiece is heated to a post-heat temperature that is greater than a dew point temperature associated with the atmospheric environment. As such, the workpiece can be subsequently transferred from the post-heat station to the atmospheric environment without condensation on the workpiece due to the lowered temperature thereof. Alternatively, transferring the workpiece from the chuck to the load lock chamber in act 320 may further comprise transferring the workpiece to a separate post-heat station, whereby the workpiece is heated to a post-heat temperature that is greater than a dew point temperature of the atmospheric environment, and then transferred from the post-heat station to the load lock chamber.

In act 322, the pressure within the load lock chamber is increased to the atmospheric pressure, and the workpiece can then be removed from the load lock chamber in act 324.

In summary, the present disclosure provides improved techniques for low temperature ion implantation by providing an apparatus and method for isolating the act of workpiece cooling from both the atmospheric environment and the process environment so that the cooling act can be performed at a pressure that is above the vacuum pressure associated with the ion implantation process chamber, while also being performed in a controlled environment where the workpiece is not susceptible to condensation as a result of exposure of the cold workpiece to the relative humidity of the ambient atmospheric environment.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
an ion source configured to provide a plurality of ions to a workpiece positioned in a process chamber, wherein the process chamber has a process environment associated therewith;
a chuck configured to support the workpiece within the process chamber during exposure of the workpiece to the plurality of ions;
a load lock chamber operably coupled to the process chamber, said load lock chamber being configured to enable transfer of the workpiece to and from an atmospheric environment and the process environment, said load lock chamber including a load lock workpiece support configured to support the workpiece during the transfer of the workpiece;
an isolation chamber operably coupled to the process chamber and having a pre-implant cooling environment defined therein, wherein the isolation chamber comprises an isolation gate valve configured to selectively isolate the pre-implant cooling environment from the process environment and to selectively permit access of the workpiece to the pre-implant cooling environment, wherein the isolation chamber comprises a pre-implant cooling workpiece support configured to support and cool the workpiece within the pre-implant cooling environment, and wherein the isolation gate valve defines the only access path for the workpiece to enter and exit the isolation chamber to or from the process chamber;
a pressurized gas source operably coupled to the isolation chamber, wherein the pressurized gas source is configured to selectively pressurize the pre-implant cooling environment to a pre-implant cooling pressure when the isolation gate valve is closed, and wherein the pre-implant cooling pressure is greater than a process pressure of the process environment;
a workpiece transfer arm configured to selectively transfer the workpiece between two or more of the load lock chamber, the isolation chamber, and the process chamber; and
a controller configured to selectively transfer the workpiece between the load lock workpiece support, the pre-implant cooling workpiece support, and the chuck via a control of the workpiece transfer arm, and wherein the controller is further configured to selectively cool the workpiece to a pre-implant cooling temperature within the isolation chamber at the pre-implant cooling pressure via a control of the isolation gate valve, the pre-implant cooling workpiece support, and the pressurized gas source.

2. The ion implantation system of claim 1, further comprising a vacuum source operably coupled to the isolation chamber, wherein the controller is further configured to selectively evacuate the isolation chamber to approximately the process pressure via a control of the vacuum source and the pre-chill gate valve.

3. The ion implantation system of claim 2, wherein the controller is configured to selectively evacuate the isolation chamber after the workpiece is cooled to the pre-implant cooling temperature at the pre-implant cooling pressure.

4. The ion implantation system of claim 1, wherein the pre-implant cooling pressure is selected from a range of pressures extending from the process pressure to atmospheric pressure.

5. The ion implantation system of claim 1, wherein the pre-implant cooling pressure is greater than atmospheric pressure.

6. The ion implantation system of claim 1, wherein the pressurized gas source comprises a dry gas comprised of one or more of desiccated air, nitrogen, and helium.

7. The ion implantation system of claim 1, wherein the pre-implant cooling workpiece support comprises a chilled platen configured to contact a bottom surface of the workpiece, thereby supporting and cooling the workpiece within the pre-implant cooling environment.

8. The ion implantation system of claim 7, wherein the chilled platen comprises one or more coolant passages defined therein, wherein the chilled platen is configured to cool the workpiece via a circulation of a coolant fluid through the coolant passages.

9. The ion implantation system of claim 8, wherein the chuck further comprises chuck coolant passages defined therein, and wherein the coolant fluid further circulates through the chuck coolant passages.

10. The ion implantation system of claim 1, wherein the chuck comprises an electrostatic clamp configured to cool the workpiece to a process temperature.

11. The ion implantation system of claim 10, wherein the chuck comprises chuck coolant passages defined therein, wherein the chuck is further configured to cool the workpiece to the process temperature via a circulation of a coolant fluid through the chuck coolant passages.

12. The ion implantation system of claim 10, wherein the process temperature is lower than the pre-implant cooling temperature.

13. The ion implantation system of claim 1, wherein the isolation chamber is adjacent to the load lock chamber.

14. The ion implantation system of claim 1, further comprising a post-heat station operably coupled to the process chamber, wherein the post-heat station comprises a heated workpiece support configured to heat the workpiece to a post-heat temperature that is greater than a dew point of the atmospheric environment.

15. The ion implantation system of claim 14, wherein the post-heat station is defined within the load lock chamber.

16. The ion implantation system of claim 1, wherein the pre-implant cooling workpiece support comprises one or more of a Peltier cooler, an expansion chamber, a cryogenic head, and a circulatory refrigeration loop.

17. The ion implantation system of claim 1, wherein the isolation chamber further comprises a pin lifter mechanism configured to selectively raise and lower the workpiece with respect to the pre-implant cooling workpiece support.

18. The ion implantation system of claim 1, wherein the controller is further configured to determine the pre-implant cooling temperature based, at least in part, on a desired process throughput.

19. The ion implantation system of claim 1, further comprising a temperature monitoring system configured to measure a temperature of the workpiece at the isolation chamber, wherein the controller is further configured to control the selective cooling of the workpiece to the pre-implant cooling temperature based, at least in part, on the measured temperature of the workpiece.

20. A method for implanting ions into a workpiece at sub-ambient temperatures, the method comprising:
  providing a workpiece in an atmospheric environment at an atmospheric temperature and atmospheric pressure;
  transferring the workpiece from the atmospheric environment to a load lock chamber of an ion implantation system;
  lowering the pressure within the load lock chamber to a process pressure associated with a process environment of a process chamber;
  transferring the workpiece at the process pressure from the load lock chamber, through the process chamber, and onto a pre-implant cooling workpiece support in an isolation chamber;
  isolating the workpiece from the process pressure of the process chamber within the isolation chamber;
  raising the pressure within the isolation chamber to a pre-implant cooling pressure that is greater than the process pressure;
  cooling the workpiece to a pre-implant cooling temperature in the isolation chamber at the pre-implant cooling pressure via the pre-implant cooling workpiece support;
  lowering the pressure within the isolation chamber to the process pressure;
  transferring the workpiece from the isolation chamber to a chuck residing in the process environment of the process chamber;
  implanting ions into the workpiece;
  transferring the workpiece from the chuck to the load lock chamber;
  increasing the pressure within the load lock chamber to the atmospheric pressure; and
  transferring the workpiece from the load lock chamber to the atmospheric environment.

21. The method of claim 20, further comprising cooling the workpiece concurrent with the workpiece residing on the pre-implant cooling workpiece support.

22. The method of claim 20, further comprising cooling the chuck to a process temperature.

23. The method of claim 20, wherein the load lock chamber comprises a plurality of load lock chambers, and wherein the workpiece is configured to be transferred to any of the plurality of load lock chambers.

24. The method of claim 20, wherein the pre-implant cooling pressure comprises a range of pressures extending from the process pressure to the atmospheric pressure.

25. The method of claim 20, wherein the pre-implant cooling pressure comprises a range of pressures extending from the process pressure an elevated pressure that is greater than the atmospheric pressure.

26. The method of claim 20, wherein transferring the workpiece from the chuck to the load lock chamber further comprises:
  transferring the workpiece from the chuck to a post-heat station;
  heating the workpiece in the post-heat station to a post-heat temperature that is greater than a dew point of the atmospheric environment; and
  transferring the workpiece from the post-heat station to the load lock chamber.

27. The method of claim 20, wherein cooling the workpiece in the isolation chamber comprises flowing a cooling fluid through the pre-implant cooling workpiece support.

28. The method of claim 27, further comprising flowing the cooling fluid through the chuck, therein cooling the chuck.

* * * * *